United States Patent
Noguchi (10) Patent No.: US 7,379,007 B2
(45) Date of Patent: May 27, 2008

(54) A/D CONVERTER, A/D CONVERTER APPARATUS, AND SAMPLING CLOCK SKEW CONTROL METHOD

(75) Inventor: Hidemi Noguchi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/441,084

(22) Filed: May 26, 2006

(65) Prior Publication Data
US 2006/0267826 A1 Nov. 30, 2006

(30) Foreign Application Priority Data
May 27, 2005 (JP) .............................. 2005-155226

(51) Int. Cl.
*H03M 1/12* (2006.01)
(52) U.S. Cl. .................. 341/155; 341/118; 341/159
(58) Field of Classification Search ................. 341/159
See application file for complete search history.

(56) References Cited

U.S. PATENT DOCUMENTS

| | | | | |
|---|---|---|---|---|
| 4,633,226 A | * | 12/1986 | Black, Jr. ................... | 341/159 |
| 4,924,225 A | * | 5/1990 | Dingwall et al. ........... | 341/118 |
| 5,254,995 A | * | 10/1993 | Hantke ........................ | 341/159 |
| 5,291,198 A | * | 3/1994 | Dingwall et al. ........... | 341/159 |
| 5,673,046 A | * | 9/1997 | Hirajima et al. ............ | 341/159 |
| 6,005,507 A | * | 12/1999 | Nakatsu et al. ............. | 341/155 |
| 6,288,665 B1 | * | 9/2001 | Tsukamoto et al. ......... | 341/155 |
| 6,473,131 B1 | * | 10/2002 | Neugebauer et al. ....... | 348/572 |
| 6,593,871 B1 | * | 7/2003 | Miethig et al. ............. | 341/157 |
| 6,784,821 B1 | * | 8/2004 | Lee ............................. | 341/155 |
| 6,888,488 B2 | * | 5/2005 | Takakusagi et al. ........ | 341/155 |
| 2006/0038711 A1 | * | 2/2006 | Chou et al. ................. | 341/155 |

OTHER PUBLICATIONS

IEEE International Solid-State Circuits Conference, "Digest of Technical Papers" pp. 146-148. 1972.

* cited by examiner

*Primary Examiner*—Khai M. Nguyen
(74) *Attorney, Agent, or Firm*—Sughrue Mion, PLLC (57) ABSTRACT

A parallel A/D converter includes a plurality of comparators for comparing an input signal in parallel, an input signal line for distributing the input signal to the plurality of comparators, and a sampling clock distributor for distributing sampling clock for sampling the input signal to the plurality of comparators at a distribution timing determined according to delay of the input signal due to the input signal line.

13 Claims, 7 Drawing Sheets

A/D CONVERTER, A/D CONVERTER APPARATUS, AND SAMPLING CLOCK SKEW CONTROL METHOD

BACKGROUND OF THE INVENTION

1. Field of the Invention

The present invention generally relates to an A/D converter and an A/D converter apparatus and more particularly relates to a parallel A/D converter and an A/D converter apparatus.

2. Description of Related Art

Figure 9:
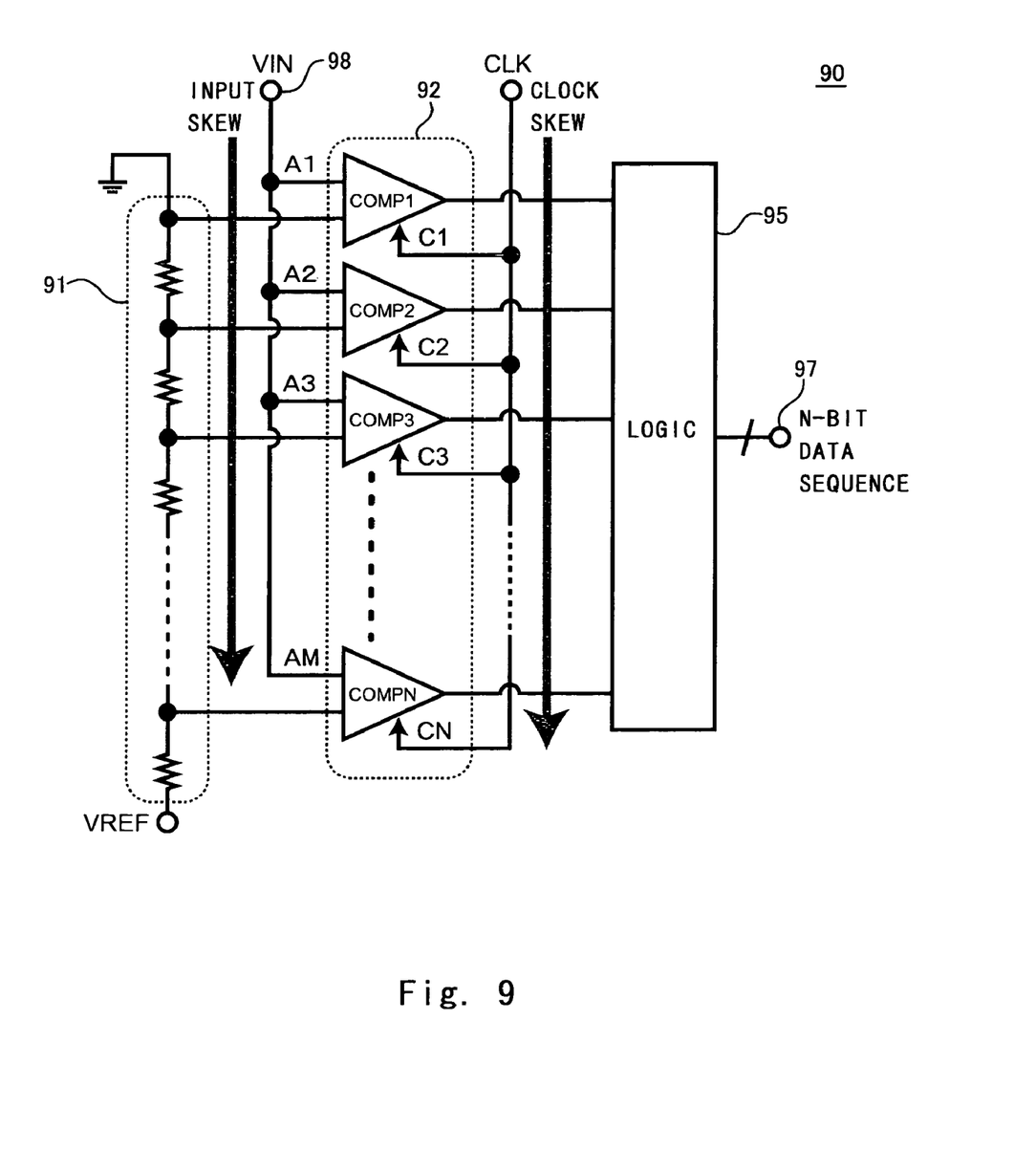
FIG. 9 is a view showing a parallel A/D converter according to a related art.

Two types of A/D converters are widely known: successive approximation type A/D converter and flash type A/D converter (parallel A/D converter). FIG. 9 is a block diagram that schematically shows a parallel A/D converter. As shown in FIG. 9, the parallel A/D converter 90 includes a voltage dividing resistor string 91, a plurality of comparators 92 and an encoder 95. The output of the encoder 95 is connected to a digital output terminal 97. The input of the encoder 95 is connected to the plurality of comparators 92. One input terminal of each comparator 92 is connected to an analog input terminal 98 and the other input terminal is connected to one end of each voltage dividing resistor of the voltage dividing resistor string 91. One end of the voltage dividing resistor string 91 is connected to a reference input voltage VREF and the other end is grounded.

The operation of the parallel A/D converter 90 is described below. An analog input voltage VIN input through the analog input terminal 98 is supplied to each comparator. Each comparator compares the analog input voltage VIN with a reference voltage that is divided from the reference input voltage VREF by each voltage dividing resistor in synchronization with a clock CLK. The encoder 95 encodes the analog input voltage VIN into N-bit binary data sequence DOUT according to the output from the comparator 92.

The conversion from the analog value VIN into the digital value DOUT is achieved as a result of the voltage comparison in each comparator and the encoding to the N-bit binary data sequence DOUT in the encoder 95. Such a typical A/D converter is described in 1972 IEEE International Solid-State Circuits Conference, "DIGEST OF TECHNICAL PAPERS" pp 146-148.

The parallel A/D converter 90 needs to have $2^N$ number of comparators to generate the N-bit binary data sequence DOUT. Accordingly, generation of data with a larger number of bits requires a larger circuit size and area. The increase in the area of the A/D converter 90 undesirably leads to an increase in the skew of the analog input voltage VIN due to line delay and the skew of the clock signal CLK due to line delay. If the skews of the voltage VIN and the signal CLK differ, it is difficult for the plurality of comparators to sample the analog signals at the same time. This results in deterioration of the conversion accuracy of the A/D converter 90.

Figure 10A:
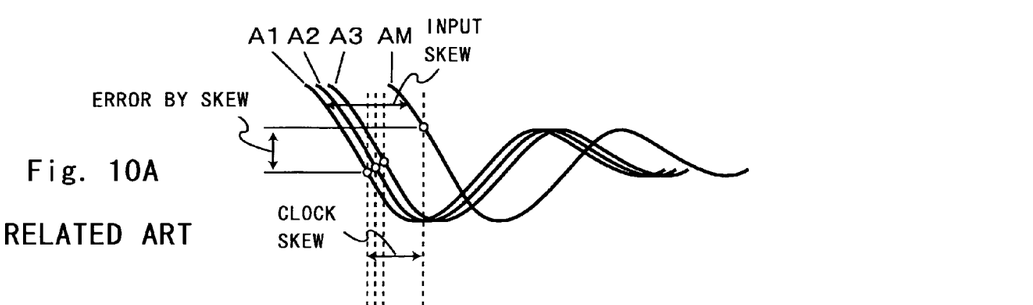
FIGS. 10A and 10B are views describing errors due to skew of an analog signal and skew of a clock signal according to a related art.
Figure 10B:
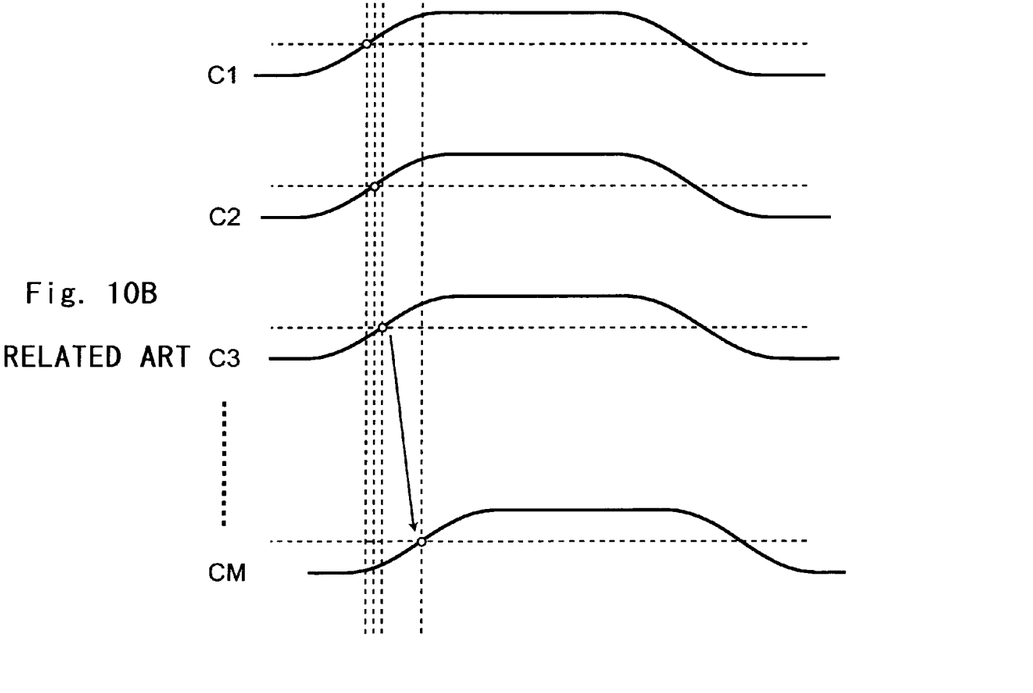

FIG. 10 is a timing chart to describe data errors caused by the difference in skew of the analog input signal VIN and the clock signal CLK. The waveforms indicated by A1, A2, to AM ($M=2^N$) in FIG. 10 show the analog input signals VIN that are input to the comparator in the first stage to the comparator in the Mth stage, respectively. The Mth stage comparator receives the analog signal AM having a phase delayed compared with the signal received by the first-stage comparator due to delay in the signal line. The waveforms indicated by C1 to CM ($M=2^N$) in FIG. 10 show the clock signals CLK that are input to the comparator in the first stage to the comparator in the Mth stage, respectively. The clock that is input to the Mth stage comparator has a phase delayed compared with the clock that is input to the first-stage comparator due to delay in the clock line. As shown in FIG. 10A and FIG. 10B, the larger the number of comparators used in the A/D converter 90 is, the larger a difference between a delay time due to the signal line and a delay time due to the clock line. This causes deviation in the phase of the input signal VIN and the phase of the clock signal CLK, thus failing to sample the input signals of the same time in some cases. This degrades the accuracy of the generated digital signal DOUT.

Though it is possible to adjust the layout to form equal length lines in order to prevent errors due to skew, the drawback can be hardly overcome by merely changing the layout of line length due to the increase in circuit area. It is also possible to place a sample and hold circuit in the previous stage of the A/D converter 90. However, the sample and hold circuit that is compatible with a high-speed operation, which is the characteristics of the parallel A/D converter 90, has a low accuracy. A highly accurate sample and hold circuit cannot follow the high-speed operation. Because of this trade-off, the use of a sample and hold circuit to overcome the drawback of skew is not effective.

As described in the foregoing, the present invention has recognized that the A/D converter apparatus and the A/D converter of the related art cannot achieve high-speed and highly-accurate A/D conversion due to the deviation between the skew of the analog input signal and the skew of the clock signal.

SUMMARY OF THE INVENTION

According to an aspect of the present invention, there is provided a parallel A/D converter, which includes a plurality of comparators for comparing an input signal in parallel, an input signal line for distributing the input signal to the plurality of comparators, and a sampling clock distributor for distributing sampling clock for sampling the input signal to the plurality of comparators at a distribution timing determined according to delay of the input signal due to the input signal line.

According to another aspect of the present invention, there is provided a sampling clock skew control method of a parallel A/D converter apparatus receiving a signal, sampling the signal in accordance with a sampling clock and outputting digital data, which includes generating a prescribed training signal, outputting from an A/D converter a digital output signal digitalized from the training signal, measuring a prescribed parameter of the digital output signal, and controlling an output timing of the sampling clock according to the prescribed parameter.

According to yet another aspect of the present invention, there is provided a sampling clock skew control method of a parallel A/D converter apparatus receiving a signal, sampling the signal in accordance with a sampling clock and outputting digital data, which includes outputting from an A/D converter a digital output signal digitalized from the signal, correcting an error contained in the digital output signal, and controlling skew of the sampling clock according to a ratio of the digital output signal whose error is corrected with respect to the digital output signal.

The present invention enables control to optimize skew of a clock signal with respect to skew of an analog input signal in accordance with a digital output signal output from an A/D converter, thereby achieving the provision of a high speed and highly accurate A/D converter.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Figure 1:
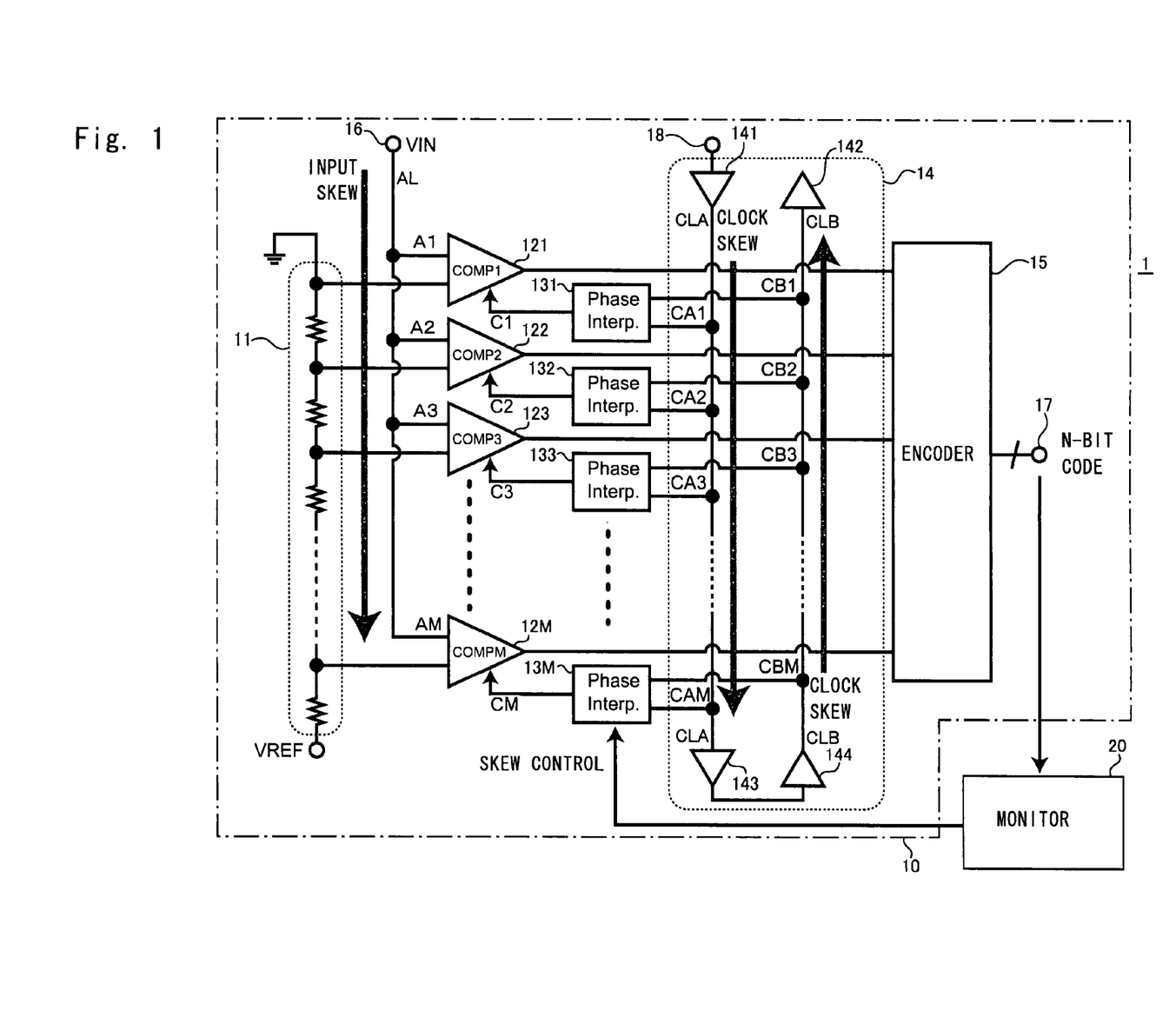
FIG. 1 is a block diagram showing the configuration of an A/D converter apparatus according to an embodiment of the present invention.

An embodiment of the present invention is described hereinafter with reference to the drawings. FIG. 1 is a block diagram showing the configuration of an A/D converter apparatus according to a first embodiment of the invention. The A/D converter apparatus 1 of this embodiment includes a parallel A/D converter 10 and a monitor 20. The A/D converter 10 outputs N-bit data sequence DOUT in response to an analog input voltage VIN. As shown in FIG. 1, the A/D converter 10 of this embodiment includes a voltage dividing resistor string 11, a plurality of comparators 121 to 12M ($M=2^N$), a plurality of phase interpolators 131 to 13M ($M=2^N$), a clock line section 14 and an encoder 15.

One end of the voltage dividing resistor string 11 is connected to a reference voltage VREF and the other end is grounded. Each node between the resistors of the voltage dividing resistor string 11 is connected to one input terminal of each of the comparators 121 to 12M. The other input terminals of the comparators 121 to 12M are connected to an analog input line AL. The analog input line AL is connected to an analog input terminal 16. An analog input voltage VIN is input through the analog input terminal 16 and supplied to the other input terminals of the comparators 121 to 12M through the analog input line AL. The comparators 121 to 12M compare the analog input voltage VIN with the reference voltage VREF that is divided by the voltage dividing resistor string 11 in synchronization with sampling clocks C1 to CM that are output respectively from the phase interpolators 131 to 13M and outputs the comparison result.

The phase interpolators 131 to 13M receive first clock signals CA1 to CAM and second clock signals CB1 to CBM, respectively. The phase interpolators 131 to 13M output a sampling clock C having a phase that interpolates the first and the second clock signals CA and CB which are input to each phase interpolator. The phase interpolators 131 to 13M are detailed later.

The clock line section 14 supplies the first clock signals CA1 to CAM and the second clock signals CB1 to CBM to the phase interpolators 131 to 13M, respectively, through the clock buffers 141 to 144 and the clock lines CLA and CLB in accordance with a clock signal input through a clock input terminal 18. The first clock signals CA1 to CAM that are supplied to the phase interpolators 131 to 13M are transmitted through the first clock line CLA along a first direction (from the upper part to the lower part of FIG. 1). The second clock signals CB1 to CBM that are supplied to the phase interpolators 131 to 13M are transmitted through the second clock line CLB along a second direction (from the lower part to the upper part of FIG. 1). In this embodiment, the second clock line CLB is the line that turns back the first clock line CLA at the end of the plurality of comparators (the lower end of FIG. 1). In this embodiment, the clock line section 14 and the phase interpolators 13 form a sampling clock distributor.

The encoder 15 generates a digital signal that corresponds to the analog input voltage VIN based on the comparison results output from the comparators 121 to 12M and outputs it as N-bit data sequence DOUT through a data sequence output terminal 17.

Figure 2:
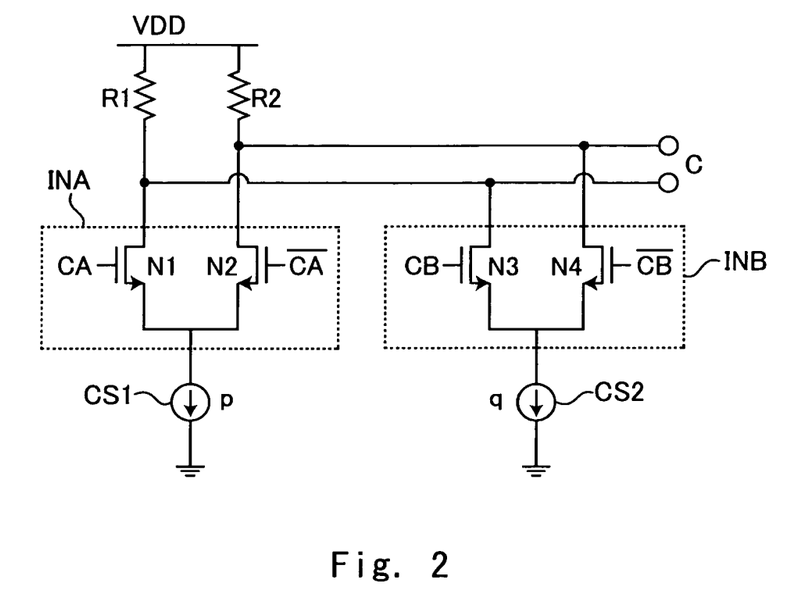
FIG. 2 is a circuit diagram showing a phase interpolator according to an embodiment of the present invention.

The configuration of the phase interpolators 131 to 13M is described herein. FIG. 2 is a circuit diagram showing the configuration of each phase interpolator. As shown in FIG. 2, the phase interpolator has a first differential input pair for receiving the first clock signal CA and a second differential input pair for receiving the second clock signal CB. The first differential input pair is connected between a power supply voltage VDD and a first current source CS1. The second differential input pair is connected between the power supply voltage VDD and a second current source CS2. The first differential input pair is composed of an NMOS transistor N1 for receiving the first clock signal CA and an NMOS transistor N2 for receiving an inverted signal /CA of the first clock signal. The second differential input pair is composed of an NMOS transistor N3 for receiving the second clock signal CB and an NMOS transistor N4 for receiving an inverted signal /CB of the second clock signal. The drains of the NMOS transistors N1 and N3 are connected to the power supply voltage VDD through a resistor R1. The drains of the NMOS transistors N2 and N4 are connected to the power supply voltage VDD through a resistor R2. The sources of the NMOS transistors N1 and N2 are connected to the first current source CS1 and the sources of the NMOS transistors N3 and N4 are connected to the second current source CS2. The first and second current sources CS1 and CS2 are variable current sources whose current values are set according to a signal (skew control signal) supplied from the monitor 20, which is described later. The output terminal of the phase interpolator is the node between the resistor R1 and the NMOS transistors N1 and N3 and the node between the resistor R2 and the NMOS transistors N2 and N4.

Figure 3:
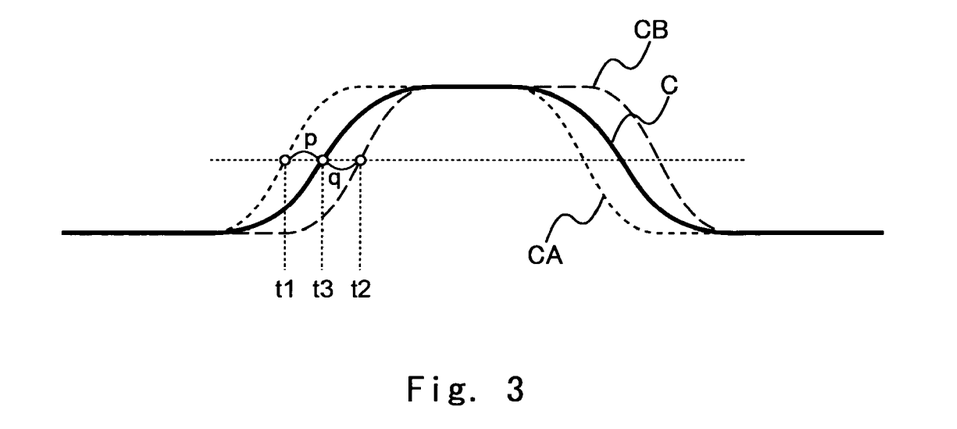
FIG. 3 is a view showing the operation of the phase interpolation circuit.

If the same current value is set to the first current source CS1 and the second current source CS2, the phase interpolator outputs a clock signal that is intermediate between the first clock signal CA and the second clock signal CB. FIG.

3 schematically shows it. The phase interpolator outputs a clock signal C that interpolates the first clock signal CA and the second clock signal CB as a sampling clock. Though FIG. 3 shows the case where the current values of the first current source CS1 and the second current source CS2 are the same, the current values of the first current source CS1 and the second current source CS2 actually differ according to the output (skew control signal) from the monitor 20. According to the difference in current value of the first current source CS1 and the second current source CS2, the timing of the clock C output from the phase interpolator varies. If the ratio of the current value of the first current source CS1 and the second current source CS2 is p:q, the clock signal rises at the point that divides a time difference between the first clock signal CA and the second clock signal CB at the ratio of q:p, for example (refer to FIG. 3).

The monitor 20 monitors the N-bit digital signal DOUT that is output from the A/D converter 10 by training operation or the like, which is described later, and outputs a signal (skew control signal) for setting the current value of the first current source CS1 and the second current source CS2 of the phase interpolator according the monitoring result. The monitor 20 determines the ratio p:q of the current value of the first current source CS1 and the second current source CS2 and outputs the signals having the same ratio to all phase interpolators 131 to 13M.

The operation of the A/D converter 1 having the above configuration is described in detail herein. The analog input voltage VIN input from the analog input terminal is supplied to the comparators 121 to 12M through the analog input line AL. While being transmitted through the analog input line AL, the analog input signal delays due to the line resistance or the like. Because of the skew of the analog input signal, the input voltage is not supplied at the same time to all the comparators 121 to 12M. If the signals input to the comparators 121 to 12M are respectively A1 to AM, the input signals A1 to AM have a certain degree of delay (skew) due to the analog signal line resistance. As briefly described with reference to FIG. 10, if a signal is transmitted through the analog line AL while bearing fixed delay of $\Delta ta$ per comparator, the signal input to the analog input terminal at time T0 is input to the comparator 12M at time $T0+2^N \Delta ta$.

When a clock signal line is formed as in a related art to transmit a sampling clock only from the upper part to the lower part of FIG. 1, for example, a sampling clock also bears delay due to the clock line; however, a degree of delay (skew) due to the analog line and a degree of delay (skew) due to the clock line differ. If the delay due to the clock line is $\Delta tc$ per comparator, the clock signal supplied to the input terminal of the clock signal at T0, which is the same time as the input of the analog signal, is input to the comparator 12M at time $T0+2^N \Delta tc$. Thus, because of the difference between $\Delta ta$ and $\Delta tc$, a difference between a degree of delay (skew) of the analog signal and a degree of delay (skew) of the clock signal is larger in the comparator in the lower part of FIG. 1.

To overcome this drawback, this embodiment applies a given degree of skew to the sampling clocks C1 to CM supplied to the comparators 121 to 12M by using the first clock signals CA1 to CAM supplied through the first clock line CIA, the second clock signals CB1 to CBM supplied through the second clock line CLB and the phase interpolators 131 to 13M. In other words, the degree of delay on the clock signal from the sampling clock C1 supplied to the first-stage comparator to the sampling clock CM supplied to the Mth stage comparator is set to correspond to the degree of delay on the analog signal due to the analog line AL.

The sampling clocks C1 to CM are clocks for determining the timing when the comparators 121 to 12M compare the input voltages A1 to AM with the reference voltage. This embodiment applies the same skew as the input signal A1 to AM to the sampling clocks C1 to CM, thereby setting the analog input signals compared by the comparators to be the signals of the same time.

Figure 4:
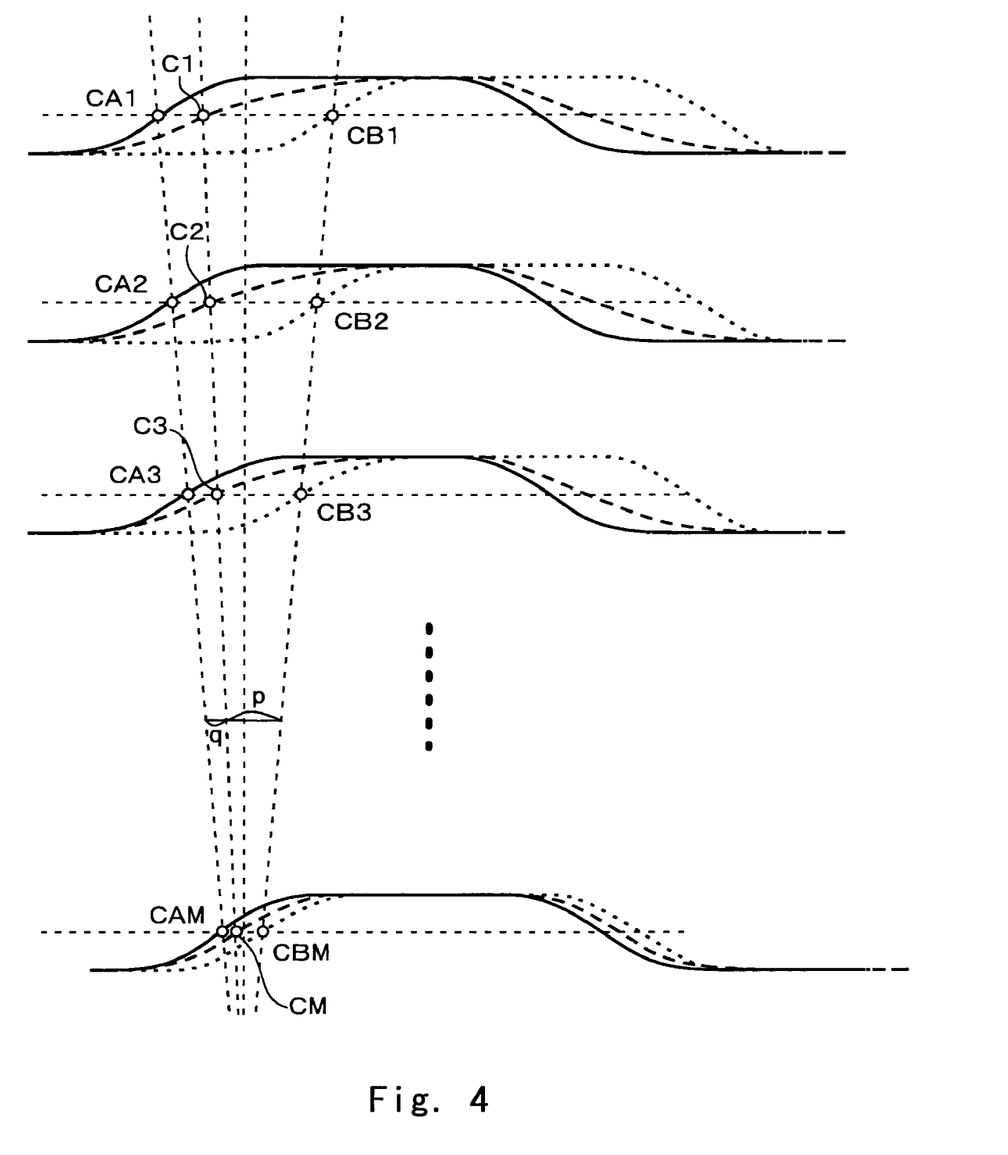
FIG. 4 is a view describing the operation for clock skew control according to an embodiment of the present invention.

FIG. 4 is a waveform chart that schematically shows the first clock signals CA1 to CAM, the second clock signals CB1 to CBM that are input to the phase interpolators 131 to 13M and the sampling clocks C1 to CM that are output from the phase interpolators 131 to 13M. A method for applying a desired degree of skew to the sampling clocks C1 to CM to be input to the comparators is described hereinafter with reference to FIGS. 1 and 4.

As described above, the first clock CA is transmitted through the first clock line CIA from the upper part to the lower part of FIG. 1 in this embodiment. Since the second clock line CLB is the line that turns back the first clock linen CLA at the lower end, the second clock CB is transmitted through the second clock line CLB from the lower part to the upper part of FIG. 1. Specifically, the first clock signal CA is supplied to the phase interpolator 131 at the earliest (refer to CA1 in FIG. 4). The signal CA is then sequentially supplied to the phase interpolators 132, 133 and so on with certain delay due to the clock line CIA. Finally, the clock signal CA is supplied to the phase interpolator 13M at the latest (refer to FIG. 4). On the other hand, the second clock signal CB is supplied to the phase interpolator 13M in the turning end at the earliest and supplied to the phase interpolator 131 at the latest (refer to CBM and CB1 of FIG. 4).

In this embodiment, signals that equally assign weights of p:q is input to the first current source CS1 and the second current source CS2 of the phase interpolators 131 to 13M. Thus, all the interpolators output the sampling clocks C1 to CM at the timing for dividing a time difference between the input timing of the first clock signal CA and the input timing of the second clock signal CB at the ratio of q:p, for example.

By equally assigning weights to the first and second current sources CS1 and CS2 of the phase interpolators 131 to 13M, it is possible to create given skew to change the degree of delay of the clocks Cl to CM output from the phase interpolators 131 to 13M. FIG. 4 schematically shows the case of adding skew to sampling clocks in this manner.

As shown in FIG. 4, the first-stage phase interpolator 131 outputs the sampling clock C1 at the time point to divide a time difference between the first clock CA1 input at the earliest and the second clock CB1 input at the latest at the ratio of q:p. On the other hand, the Mth stage phase interpolator 13M outputs the sampling clock CM at the time point to divide a time difference between the first clock CAM input at the latest and the second clock CBM input at the earliest at the ratio of q:p.

As described above, the A/D converter of this embodiment sets the ratio of p:q equally to all the phase interpolators 131 to 13M, thereby generating the sampling clocks C1 to CM having given skew according to this ratio. The clock is not necessarily output at the time point for dividing at the ratio of q:p with respect to the current ratio p:q of the current sources as described above due to the structure of the phase interpolator and circuit configuration. This embodiment supplies the first clock signal and the second clock signal to all the phase interpolators (131 to 13M) and further supplies the signals (skew control signal) that designate the same setting to all the phase interpolators (131 to 13M), thereby changing the degree of delay (skew) of the sampling clocks supplied to the comparators to be closer to the degree of delay (skew) of the analog input signal.

In the configuration of the A/D converter of this embodiment, even if the analog input signal is input through the terminal at the lower end of FIG. 1 and the clock signal is input through the terminal at the upper end of FIG. 1, it is possible to set so that the clock signal C1 output from the phase interpolator at the upper end delays compared with the clock signal CM output from the phase interpolator at the lower end. The degree of delay of the clock can be thus set in accordance with the degree of delay of the input analog signal to the comparator, which enables the provision of the A/D converter that is compatible with higher speed and more highly accurate operation.

The monitor 20 for controlling the skew of the sampling clocks C1 to CM supplied to the comparators 121 to 12M in accordance with the skew of the analog input signal and the operation for controlling the skew are described hereinafter.

Figure 5:
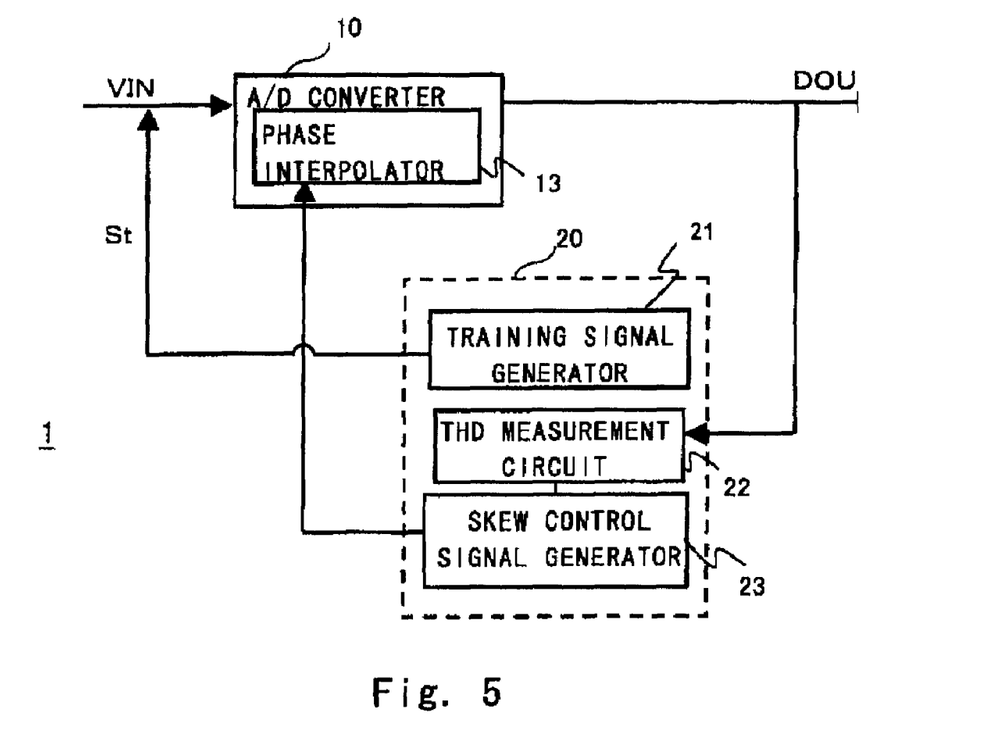
FIG. 5 is a block diagram including a monitor according to a first embodiment of the present invention.

FIG. 5 shows the configuration of the A/D converter 1 that includes the monitor 20. The monitor 20 includes a training signal generator 21, a total harmonic distortion (THD) measurement circuit 22, and a skew control signal generator 23. As shown in FIG. 5, the training signal generator 21 is connected to the analog signal input terminal of the A/D converter 10 of the first embodiment. The digital output signal DOUT of the A/D converter 10 is input to the THD measurement circuit 22 of the monitor 20. FIG. 5 illustrates the phase interpolators 131 to 13M collectively as the phase interpolator 13.

In the monitor 20 shown in FIG. 5, the training signal generator 21 generates a training signal St having a given waveform. The training signal St is a signal for testing that is generated for determining a ratio of the current values of the first current source CS1 and the second current source CS2 of the phase interpolator 13. Thus, the waveform, amplitude and so on of the training signal St are determined in advance. The THD measurement circuit 22 measures a signal distortion rate of the digital output signal DOUT converted by the A/D converter 10. The skew control signal generator 23 outputs a signal for setting the current values of the first current source CS1 and the second current source CS2 to the phase interpolators 131 to 13M. For example, the skew control signal generator 23 may generate a signal for continuously changing the ratio of the current values of the first and the second current sources during skew control process.

The operation of controlling the skew of the clocks C1 to CM using the monitor 20 as shown in FIG. 5 is described hereinafter. When adjusting the clock skew using the monitor 20 as shown in FIG. 5, the A/D converter 1 requires skew control process. The skew control process may be implemented at the timing of selection test before shipment of IC (Integrated Circuit) or at each time of circuit activation of the A/D converter 1. Alternatively, the control process may be implemented while the A/D conversion is suspended at regular time intervals.

The A/D converter 1 having the monitor 20 shown in FIG. 5 implements the skew control process at the time of circuit activation, for example. When an external signal for starting the skew control process is input to the monitor 20, the training signal generator 21 generates a training signal St. The waveform of the signal St generated by the training signal generator 21 is not particularly specified, as long as the waveform is determined in advance. The following description takes a sine wave, which can be provided most easily, as an example.

In the skew control process, the sine wave generated by the training signal generator 21 is input to the A/D converter 10. The A/D converter 10 performs A/D conversion of the training signal. At this time, a given default value is set in the phase interpolator such as using only the second current source without using the first current source, for example. The A/D converter 10 digitalizes the output signal from the training signal generator 21 and outputs a digital output signal DOUT. The THD measurement circuit 22 receives the data of the digital output signal DOUT and measures the distortion rate of the sine waveform generated based on the digital output signal DOUT.

After that, the monitor 20 repeats the measurement of the distortion rate while changing the ratio of the current values of the first current source and the second current source of the phase interpolator 13. The current ratio may be changed by gradually reducing the current value of the second current source while gradually increasing the current value of the first current source, for example. The change in the current ratio of the phase interpolator leads to the change in the skew of the sampling clock. The monitor 20 determines an optimum value of the current ratio based on the distortion rate measured from the digital signal DOUT. How the optimum current ratio is determined by the distortion rate measurement is described hereinbelow.

Figure 6:
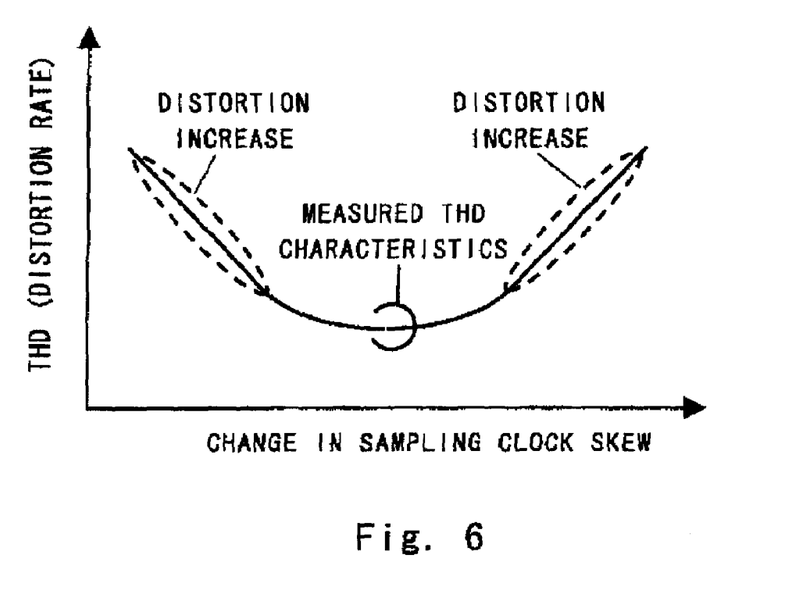
FIG. 6 is a view showing a change in THD with respect to skew control according to the first embodiment.

FIG. 6 shows variation of the distortion rate that is measured according to the change in the current ratio. In this embodiment, if the deviance between the skew of the analog input signals A1 to AM and the skew of the sampling clocks C1 to CM increases, an error with respect to the given training signal occurring when converting the digital signal increases accordingly. As a result, the distortion of the digital output signal DOUT output from the A/D converter 10 increases as the deviation of skew becomes larger (refer to FIG. 6).

Thus, this embodiment records the distortion rate of the digital output signal DOUT as changing the weights assigned to the first and the second current sources of the phase interpolator.

The embodiment then selects the point where the distortion rate of the digital output signal DOUT is the smallest and determines the ratio of the current values of the first current source and the second current source corresponding to this point to be an optimum current ratio.

When such a distortion rate measurement is performed, at the point where an optimum current ratio is determined, the monitor 20 holds this setting in a register or the like, which is not shown, and ends the skew control process. The monitor 20 shown in FIG. 5 outputs a skew control signal based on the current ratio held in the register during a subsequent normal operation (operation other than the skew control process). The phase interpolators 131 to 13M set the ratio of the current values of the first current source and the second current source to p:q according to the skew control signal. This allows the clocks C1 to CM output from the phase interpolators 131 to 13M to be the sampling clocks in accordance with the skew of the input signals A1 to AM, thereby comparing analog inputs at substantially the same time in all the comparators 121 to 12M and outputting the comparison results.

As described in the foregoing, the A/C converter apparatus 1 of this embodiment controls the skew of the sampling clocks C1 to CM used for the comparison of analog input signals so as to be an optimum value according to the skew control signal S output from the monitor 20. This enables the optimization of the skew of the clocks C1 to CM and thereby the provision of higher-speed and highly accurate A/D converter apparatus 1.

Further, implementation of the above skew control process each time activating the circuit enables the skew control in accordance with environmental variation or the like.

Though the above-described example determines the current ratio for skew control using THD, it is possible to use another parameter as long as it is capable of determining an expected value, such as power of the digital output signal DOUT, and various other embodiments are applicable, not limited to the THD measurement circuit 22. Thus, the THD measurement circuit may another circuit for measuring a digital output signal, such as an output waveform power measurement circuit.

In sum, this embodiment stores an expected value that can be determined from the training signal such as THD or power in a register or the like inside a monitor. Then, the skew control process compares the expected value with a parameter that corresponds to an expected value of the digital output signal DOUT that is obtained by digitalizing the training signal. It then controls skew so that the parameter obtained from the digital output signal becomes closer to the expected value, thereby optimizing the skew of the sampling clock.

The first embodiment places the monitor 20 inside the A/D converter 1 in order to deal with environmental variation. If the effect of environmental variation is small, it is possible to perform the skew control by generating a training pattern using a tester or the like during testing after completing IC in order to deal with process variation. Specifically, a tester may generate a training pattern, measure THD and determines a current ratio by the same skew control method as above and then writes the current ratio to a register or the like in the A/D converter.

A case of using another monitor is described hereinafter as a second embodiment. Some communication systems perform multilevel transmission when transmitting a digital signal. In the multilevel transmission, a transmitting end does not only divide the signal to the values corresponding to "L" and "H" but divides the intermediate values into a plurality of values (four-level, sixteen-level and so on) to transmit a signal that contains a large amount of information (digital data) at the same time. A receiving end that receives such a signal needs to A/D convert the received signal and reproduce the original digital data. Further, in wireless communication and high-speed communication, a receiver end often uses an A/D converter to reproduce digital data from a received signal, not only when reproducing digital data from a multilevel signal. The example of a monitor described below is particularly effective when reproducing digital data using an A/D converter.

Figure 7:
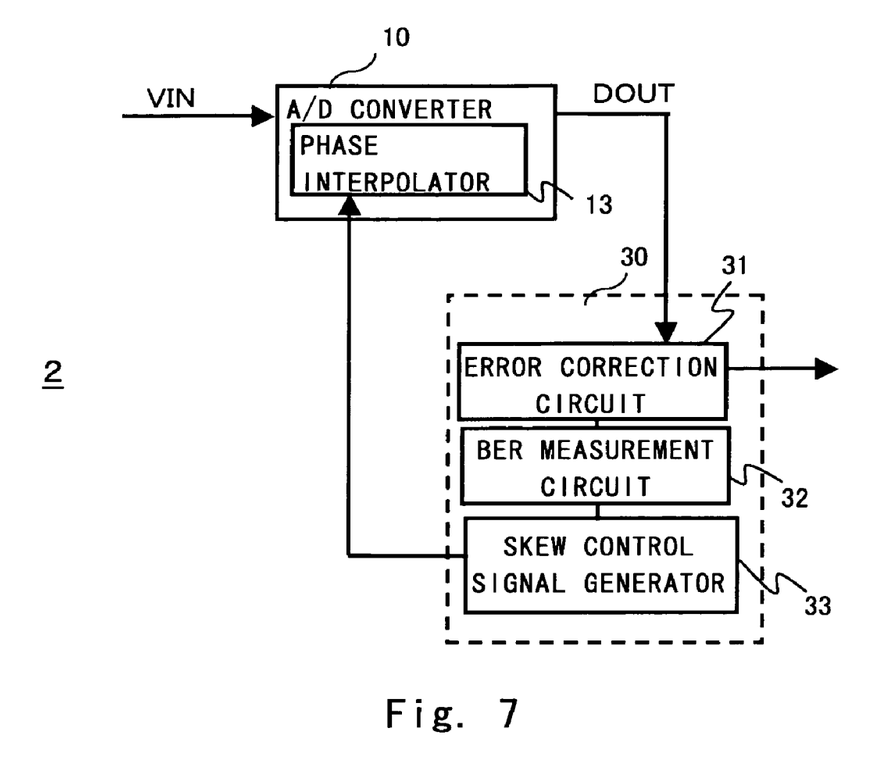
FIG. 7 is a block diagram including a monitor according to a second embodiment of the present invention.

FIG. 7 shows the configuration of an A/D converter apparatus 2 according to the second embodiment of the invention. In the second embodiment, the configuration other than the monitor 30 is the same as in the first embodiment and thus not described herein. The A/D converter apparatus 2 is different from the A/D converter apparatus 1 shown in FIGS. 1 and 5 as follows. Since the A/D converter apparatus 2 outputs reproduced digital data to a circuit in a subsequent stage, the output of the A/D converter apparatus 2 is not the output of the A/D converter 10. The digital output signal DOUT output from the A/D converter 10 is supplied to an error correction circuit 31, and the output of the error correction circuit 31 is supplied to a circuit in the subsequent stage. Since the output is supplied through the error correction circuit 31, digital data after error correction is supplied to the circuit in the subsequent stage of the A/D conversion apparatus 2.

In the A/D converter apparatus 2 of the second embodiment, a monitor 30 includes the error correction circuit 31, a bit error rate (BER) measurement circuit 32, and a skew control signal generator 33.

When using the A/D converter apparatus 2 for reproducing received digital data, the digital output signal DOUT output from the A/D converter 10 contains various information that have been added by a transmitting side. The information added by the transmitting side includes data regarding validity of the digital signal such as parity check and cyclic redundancy check (CRC) and information for correcting error in a reproduced digital signal.

The error correction circuit 31 corrects an error in the digital signal DOUT reproduced by the A/D converter 10 by using the information added by the transmitting end. In the second embodiment, the BER measurement circuit 32 measures a ratio of data that is determined to have an error by the error correction circuit 31. Specifically, the BER measurement circuit 32 measures a ratio of the signal which is determined to have an error and corrected by the error correction circuit 31 with respect to the digital output signal DOUT from the A/D converter 10. According to the measurement result in the BER measurement circuit 32, the sew control signal generator 33 outputs a signal for controlling the current ratio of the first current source and the second current source.

Figure 8:
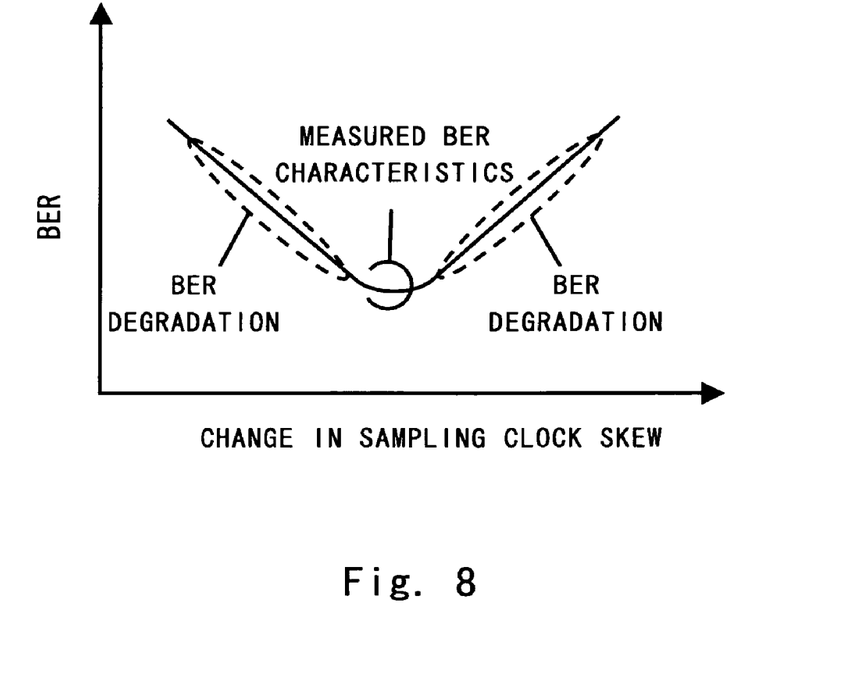
FIG. 8 is a view showing a change in BER with respect to duty according to the second embodiment of the present invention.

FIG. 8 shows a change in BER with respect to varying clock skew. As described earlier, the error increases as the phase displacement between the input signals A1 to AM and the clock signals C1 to CM increases. Thus, even if a received signal is reproduced by the A/D converter 10, the digital signal DOUT contains many errors and BER is large.

In the monitor 30 shown in FIG. 7, the BER measurement circuit 32 constantly measures BER and supplies the measurement result to the skew control signal generator 33. The skew control signal generator 33 constantly controls the skew control signal so as to reduce BER. In this way, the use of the A/D converter apparatus 2 for reproducing a received digital signal enables the measurement of BER from information contained in a received signal. This thus allows changing the skew control signal according to BER. For example, if BER exceeds a predetermined value, it is able to output a skew control signal so as to reduce BER. The A/D converter apparatus 2 of the second embodiment can thereby implement real time control (background control) of skew while performing actual data transmission by using BER, thus enabling constant obtainment of optimum skew of the sampling clock.

As described in the foregoing, the A/D converter apparatus of this embodiment can optimize the skew (degree of delay) of the clock signals C1 to CM and thereby achieve higher speed and higher accuracy. Further, by controlling the skew of sampling clocks as described above in the description of the operation of the A/D converter apparatus, the optimization of the skew of the sampling clocks can be performed appropriately in accordance with the skew of analog signals. Though the monitor measures THD from a training pattern or measures BER in the embodiments described above, this invention may be applied to other cases. For example, it is possible to generate a signal for controlling skew by using a signal noise distortion ratio (SNDR) that is measured from a signal, noise and distortion of the digital signal that is output from the A/D converter 10. When using SNDR, the monitor may be configured by extracting a signal component, a noise component, a component of distortion and so on from the frequency spectrum of the digital output signal DOUT.

Further, though the A/D converter apparatus includes the monitor 20 (or 30) in the description of the skew control operation in the above embodiments, the A/D converter is capable of skew control based on settings as long as it has the configuration of the A/D converter 10 shown in the first embodiment. Therefore, as shown in the first embodiment, the monitor operation may be performed in advance before IC shipment, and the parameter or control method in the monitor operation may be altered according to need. The present invention can provide A/D converter that is capable of skew control.

It is apparent that the present invention is not limited to the above embodiment that may be modified and changed without departing from the scope and spirit of the invention.

What is claimed is:

1. A parallel analog-to-digital converter comprising:
a plurality of comparators for comparing an input signal in parallel to a plurality of reference voltages;
an input signal line for distributing the input signal to the plurality of comparators; and
a sampling clock distributor for distributing sampling clock for sampling the input signal to the plurality of comparators at a distribution timing determined according to delay of the input signal due to the input signal line comprising:
a first clock line for transmitting a first clock signal along a first direction;
a second clock signal for transmitting a second clock signal along a second direction opposite from the first direction; and
a phase interpolator for receiving the first clock signal transmitted through the first clock line and the second clock signal transmitted through the second clock line and outputting the sampling clock at a timing dividing a time difference between the first clock signal and the second clock signal at a prescribed ratio in accordance with the distribution timing of the sampling clock.

2. The parallel analog-to-digital converter as claimed in claim 1, wherein the second clock line is a line that turns back the first clock line at an end of clock transmission path.

3. An analog-to-digital converter apparatus comprising:
the analog-to-digital converter as claimed in claim 1; and
a monitor for measuring a digital signal output from the analog-to-digital converter and determining a distribution timing of a sampling clock.

4. The analog-to-digital converter apparatus as claimed in claim 1, further comprising a monitor for measuring a digital signal output from the analog-to-digital converter and determining a distribution timing of a sampling clock.

5. The analog-to-digital converter apparatus as claimed in claim 4, wherein the monitor comprises:
a training signal generator for generating a predetermined training signal and supplying the training signal to the analog-to-digital converter;
a digital signal measurement circuit for receiving from the analog-to-digital converter a digital signal digitalized from the training signal and measuring the digital signal; and
a skew control signal generator for generating a skew control signal for determining a distribution timing of the sampling clock according to a measurement result of the digital signal measurement circuit.

6. The analog-to-digital converter apparatus as claimed in claim 4, wherein the monitor comprises:
an error correction circuit for correcting an error contained in a digital signal output from the analog-to-digital converter;
an error rate measurement circuit for measuring a ratio of the digital signal determined to have an error by the error correction circuit; and
a skew control signal generator for generating a skew control signal for determining a distribution timing of the sampling clock according to a measurement result of the error rate measurement circuit.

7. The analog-to-digital converter apparatus as claimed in claim 6, wherein the monitor generates the skew control signal so as to minimize an error rate measured by the error rate measurement circuit.

8. An analog-to-digital converter apparatus comprising:
a plurality of comparators for comparing an input signal in parallel to a plurality of reference voltages;
an input signal line for distributing the input signal to the plurality of comparators;
a sampling clock distributor for distributing a sampling clock for sampling the input signal to the plurality of comparators at a distribution timing determined according to delay of the input signal due to the input signal line; and
a monitor for measuring a digital signal output from the analog-to-digital converter and determining a distribution timing of a sampling clock.

9. The analog-to-digital converter apparatus as claimed in claim 8, wherein the monitor comprises:
a training signal generator for generating a predetermined training signal and supplying the training signal to the analog-to-digital converter;
a digital signal measurement circuit for receiving from the analog-to-digital converter a digital signal digitalized from the training signal and measuring the digital signal; and
a skew control signal generator for generating a skew control signal for determining a distribution timing of the sampling clock according to a measurement result of the digital signal measurement circuit.

10. The analog-to-digital converter apparatus as claimed in claim 8, wherein the monitor comprises:
an error correction circuit for correcting an error contained in a digital signal output from the analog-to-digital converter;
an error rate measurement circuit for measuring a ratio of the digital signal determined to have an error by the error correction circuit; and
a skew control signal generator for generating a skew control signal for determining a distribution timing of the sampling clock according to a measurement result of the error rate measurement circuit.

11. The analog-to-digital converter apparatus as claimed in claim 10, wherein the monitor generates the skew control signal so as to minimize an error rate measured by the error rate measurement circuit.

12. A sampling clock skew control method of a parallel analog-to-digital converter apparatus receiving a signal, sampling the signal in accordance with a sampling clock and outputting digital data, comprising:
generating a prescribed training signal;
outputting from an analog-to-digital converter a digital output signal digitalized from the training signal;
measuring a prescribed parameter of the digital output signal; and controlling an output timing of the sampling clock according to the prescribed parameter.

13. A sampling clock skew control method of a parallel analog-to-digital converter apparatus receiving a signal, sampling the signal in accordance with a sampling clock and outputting digital data, comprising:

outputting from an analog-to-digital converter a digital output signal digitalized from the signal;

measuring a bit error rate of the digital output signal;

correcting an error contained in the digital output signal; and controlling skew of the sampling clock based on the measured bit error rate according to a ratio of the digital output signal whose error is corrected with respect to the digital output signal.

* * * * *